(12) United States Patent
He et al.

(10) Patent No.: US 12,101,871 B2
(45) Date of Patent: Sep. 24, 2024

(54) CIRCUIT BOARD USING THERMOCOUPLE TO DISSIPATE GENERATED HEAT AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

(72) Inventors: Huan-Yu He, Shenzhen (CN); Mei-Hua Huang, Shenzhen (CN); Biao Li, Shenzhen (CN); Jin-Cheng Wu, Huai an (CN)

(73) Assignees: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

( * ) Notice: Subject to any disclaimer, the term of this patent is extended or adjusted under 35 U.S.C. 154(b) by 227 days.

(21) Appl. No.: 17/844,170

(22) Filed: Jun. 20, 2022

(65) Prior Publication Data
US 2023/0389170 A1 Nov. 30, 2023

(30) Foreign Application Priority Data
May 25, 2022 (CN) .......................... 202210577264.8

(51) Int. Cl.
*H05K 1/02* (2006.01)
*H05K 1/09* (2006.01)
(Continued)

(52) U.S. Cl.
CPC ......... *H05K 1/0209* (2013.01); *H05K 1/0298* (2013.01); *H05K 1/09* (2013.01);
(Continued)

(58) Field of Classification Search
CPC ...... H05K 1/0209; H05K 1/0298; H05K 1/09; H05K 2201/0367; H05K 2201/10219; H10N 10/852
See application file for complete search history.

(56) References Cited

U.S. PATENT DOCUMENTS 8,319,331 B2 * 11/2012 Ibaraki .................... H01L 23/38
257/693

FOREIGN PATENT DOCUMENTS

KR       20210156650 A  * 12/2021  ........... H05K 1/0207

OTHER PUBLICATIONS

English translation of KR 20210156650 A (Year: 2021).*

* cited by examiner

*Primary Examiner* — Mukundbhai G Patel
(74) *Attorney, Agent, or Firm* — ScienBiziP, P.C.

(57) ABSTRACT

A circuit board utilizing thermocouples for improved heat dissipation performance from circuit boards includes a heat dissipation module which itself includes a first circuit substrate, a thermocouple, and a second circuit substrate. The first circuit substrate includes a first wiring layer comprising first and second wiring portions. The thermocouple includes a P-type and an N-type semiconductor. The second circuit substrate includes a second wiring layer with a third wiring portion. Conductive members electrically connect the P-type semiconductor with the first wiring portion, connect the P-type semiconductor with the third wiring portion, connect the N-type semiconductor with the second wiring portion, and connect the N-type semiconductor with the third wiring (Continued)

portion, to transfer away heat generated by working elements mounted on the board.

9 Claims, 15 Drawing Sheets

(51) Int. Cl.
    *H05K 3/06*           (2006.01)
    *H05K 3/46*           (2006.01)
    *H10N 10/852*       (2023.01)

(52) U.S. Cl.
    CPC .............. *H05K 3/06* (2013.01); *H05K 3/4664* (2013.01); *H10N 10/852* (2023.02); *H05K 2201/0367* (2013.01); *H05K 2201/10219* (2013.01)

CIRCUIT BOARD USING THERMOCOUPLE TO DISSIPATE GENERATED HEAT AND METHOD FOR MANUFACTURING THE SAME

FIELD

The disclosure relates to field of circuit board manufacturing, and more particularly, to a circuit board having a thermocouple and a method for manufacturing the circuit board.

BACKGROUND

Electronic devices, such as smart phones, watches, or tablet computers, become smaller, lighter, and more multi-functional every day. Since an internal space of the electronic device is limited, heat generated by various electronic components mounted in the internal space needs to be timely dissipated. A circuit board may use silica gel, copper foil, graphene, or other materials to dissipate such heat (which is called passive heat dissipation), but the heat dissipation efficiency may not be optimal. Improvement in the art is desired.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Figure 1:
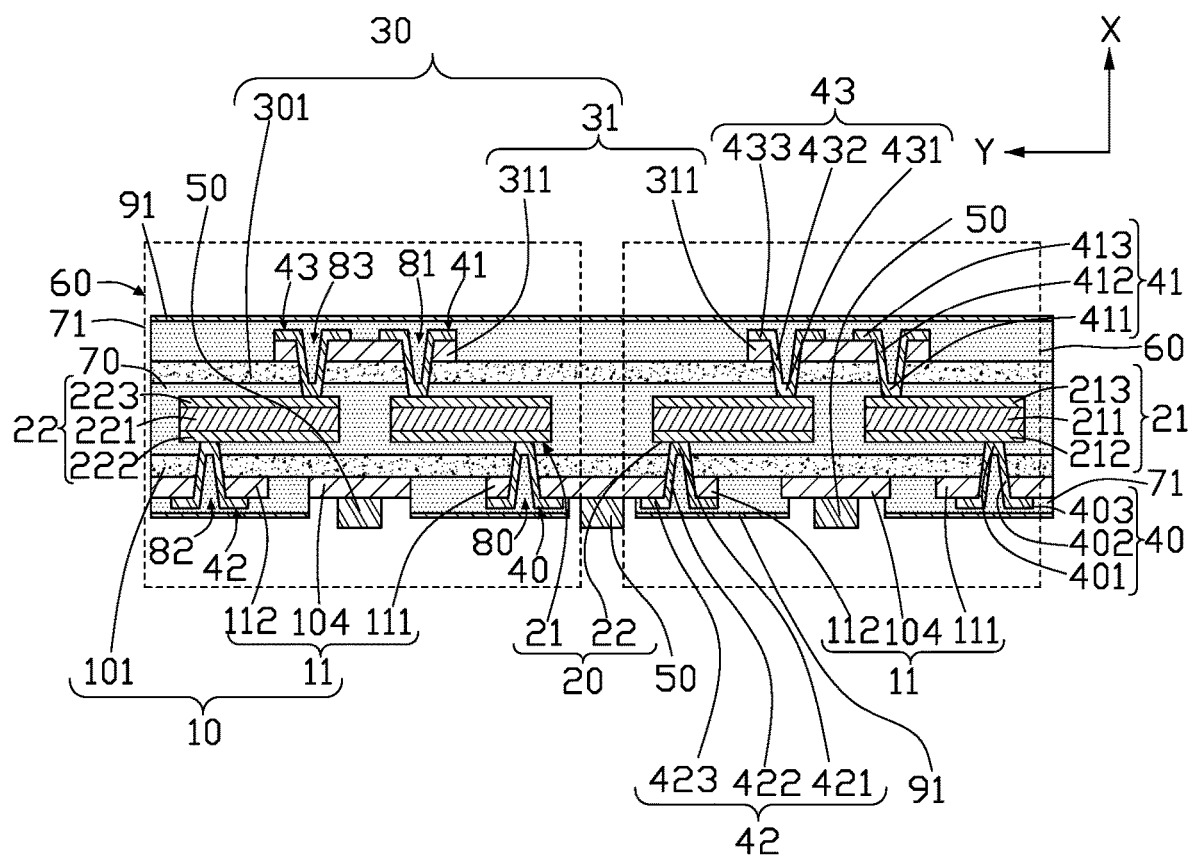
FIG. 1 is a diagrammatic view of a circuit board according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a circuit board 100 is provided according to an embodiment of the present disclosure. The circuit board 100 includes at least one heat dissipation module 60. Each heat dissipation module 60 includes a first circuit substrate 10, a thermocouple 20, and a second circuit substrate 30 stacked along a first direction X. The thermocouple 20 is embedded between the first circuit substrate 10 and the second circuit substrate 30.

The first circuit substrate 10 includes a first wiring layer 11 and a first base layer 101 stacked along the first direction X. The first wiring layer 11 includes a first wiring portion 111 and a second wiring portion 112. In a same heat dissipation module 60, the first wiring portion 111 and the second wiring portion 112 are spaced from each other in a second direction Y perpendicular to the first direction X.

The second circuit substrate 30 includes a second base layer 301 and a second wiring layer 31 stacked along the first direction X. The second wiring layer 31 includes a third wiring portion 311.

The thermocouple 20 includes a P-type semiconductor 21 and an N-type semiconductor 22, which are disposed in the second direction Y.

The heat dissipation module 60 further includes a first conductive member 40, a second conductive member 41, a third conductive member 42, and a fourth conductive member 43. The first conductive member 40 is electrically connected to the P-type semiconductor 21 and the first wiring portion 111. The second conductive member 41 is electrically connected to the P-type semiconductor 21 and the third wiring portion 311. The third conductive member 42 is electrically connected to the N-type semiconductor 22 and the second wiring portion 112. The fourth conductive member 43 is electrically connected to the N-type semiconductor 22 and the third wiring portion 311. In a same heat dissipation module 60, the second conductive member 41 and the fourth conductive member 43 are spaced from each other in the second direction Y. Each of the second conductive member 41 and the fourth conductive member 43 is connected to the third wiring portion 311. As such, the P-type semiconductor 21 and the N-type semiconductor 22 of the thermocouple 20 are connected in series.

In use, an electronic component, such as a chip, can be installed on the second circuit substrate 30. A positive electrode of an external power supply is connected to the second wiring portion 112, and a negative electrode of the external power supply is connected to the first wiring portion 111. According to Peltier principle, the second wiring layer 31 absorbs heat and the first wiring layer 11 dissipates heat, thereby transferring heat from the second wiring layer 31 to the first wiring layer 11 (which may be called active heat dissipation). Moreover, by disposing the thermocouple 20 between the first circuit board 10 and the second circuit board 30, the space inside the circuit board 100 is better utilized.

In at least one embodiment, in the first direction X, the circuit board 100 includes only one first circuit board 10 and only one second circuit board 30. In other embodiments, the number of the first circuit board(s) 10 or the number of the second circuit board(s) 30 may be changed.

In at least one embodiment, referring to FIG. 1, the circuit board 100 includes at least two heat dissipation modules 60 spaced from each other in the second direction Y. The third wiring portions 311 in different heat dissipation modules 60 are spaced from each other along the second direction Y. The second wiring portion 112 in one heat dissipation module 60 is electrically connected to the first wiring portion 111 of another adjacent heat dissipation module 60. When additional heat dissipation modules 60 are included, the heat dissipation effect is improved. In other embodiments, the first wiring portion 111 of one heat dissipation module 60 may be unconnected with the second wiring portion 112 of an adjacent heat dissipation module 60.

In at least one embodiment, referring to FIG. 1, the first wiring layer 11 further includes a heat dissipation pad 104. Each heat dissipation module 60 further includes a bump 50 protruding from the heat dissipation pad 104. In same heat dissipation module 60, the first wiring portion 111, the heat dissipation pad 104 and the second wiring portion 112 are spaced from each other in the second direction Y. The bump 50 dissipates the heat accumulated on the first wiring layer 11 and improves the heat dissipation area of the circuit board 100. Thus, the heat dissipation performance of the circuit board 100 is improved.

In at least one embodiment, the P-type semiconductor 21 includes a P-type semiconductor layer 211. The N-type semiconductor 22 includes an N-type semiconductor layer 221. Each of the P-type semiconductor layer 211 and the N-type semiconductor layer 221 is made of bismuth telluride, which improves the cooling efficiency of the heat dissipation module 60.

The P-type semiconductor 21 may further include a first conductive layer 212 and a second conductive layer 213 disposed on opposite surfaces of the P-type semiconductor layer 211. The first conductive layer 212 is electrically connected to the first conductive member 40 and the P-type semiconductor layer 211. Each of the first conductive layer 212 and the second conductive layer 213 may be made of copper or silver. The second conductive layer 213 is electrically connected to the second conductive member 41 and the P-type semiconductor layer 211. The first conductive layer 212 and the second conductive layer 213 protect the P-type semiconductor 21 and improves the conductivity of the P-type semiconductor 21.

The N-type semiconductor 22 may further include a third conductive layer 222 and a fourth conductive layer 223 disposed on opposite surfaces of the N-type semiconductor layer 221. The third conductive layer 222 is electrically connected to the third conductive member 42 and the N-type semiconductor layer 221. The fourth conductive layer 223 is electrically connected to the fourth conductive member 43 and the N-type semiconductor layer 221. Each of the third conductive layer 222 and the fourth conductive layer 223 may be made of copper or silver. The third conductive layer 222 and the fourth conductive layer 223 protect the N-type semiconductor 22 and improves the conductivity of the N-type semiconductor 22. Thus, the thermocouple 20 can both have improved cooling and conductive performances.

In at least one embodiment, referring to FIG. 1, the first circuit substrate 10 defines a first opening 80 and a third opening 82. The first opening 80 extends towards the P-type semiconductor 21. The third opening 82 extends towards the N-type semiconductor layer 221. The second circuit substrate 30 defines a second opening 81 and a fourth opening 83. The second opening 81 extends towards the P-type semiconductor 21. The fourth opening 83 extends towards the N-type semiconductor 22. The first conductive member 40 and the second conductive member 41 are respectively disposed in the first opening 80 and the second opening 81, and are used for electrically connecting to the P-type semiconductor 21. The third conductive member 42 and the fourth conductive member 43 are respectively disposed in the third opening 82 and the fourth opening 83, and are used for electrically connecting to the N-type semiconductor 22.

In at least one embodiment, the first conductive member 40 includes a first portion 401, a third portion 403, and a second portion 402 electrically connecting the first portion 401 to the third portion 403. The first portion 401 is disposed on the P-type semiconductor 21. The second portion 402 is disposed on a sidewall of the first opening 80. The third portion 403 is disposed on a surface of the first wiring portion 111 away from the P-type semiconductor 21. The first conductive member 40 includes, but is not limited to, metals such as copper, iron, and silver.

The second conductive member 41 includes a first portion 411, a third portion 413, and a second portion 412 electrically connecting the first portion 411 to the third portion 413. The first portion 411 is disposed on the P-type semiconductor 21. The second portion 412 is disposed on a sidewall of the second opening 81. The third portion 413 is disposed on a surface of the third wiring portion 311 away from the P-type semiconductor 21. The second conductive member 41 includes, but is not limited to, metals such as copper, iron, and silver.

The third conductive member 42 includes a first portion 421, a third portion 423, and a second portion 422 electrically connecting the first portion 421 to the third portion 423. The first portion 421 is disposed on the N-type semiconductor 22. The second portion 422 is disposed on a sidewall of the third opening 82. The third portion 423 is disposed on a surface of the second wiring portion 112 away from the N-type semiconductor 22. The third conductive member 42 includes, but is not limited to, metals such as copper, iron, and silver.

The fourth conductive member 43 includes a first portion 431, a third portion 433, and a second portion 432 electrically connecting the first portion 431 to the third portion 433. The first portion 431 is disposed on the N-type semiconductor 22. The second portion 432 is disposed on a sidewall of the fourth opening 83. The third portion 433 is disposed on a surface of the third wiring portion 311 away from the N-type semiconductor 22. The fourth conductive member 43 includes, but is not limited to, metals such as copper, iron, and silver.

In other embodiments, each of the first conductive member 40, the second conductive member 41, the third conductive member 42, and the fourth conductive member 43 may be a conductive column.

Figure 15:
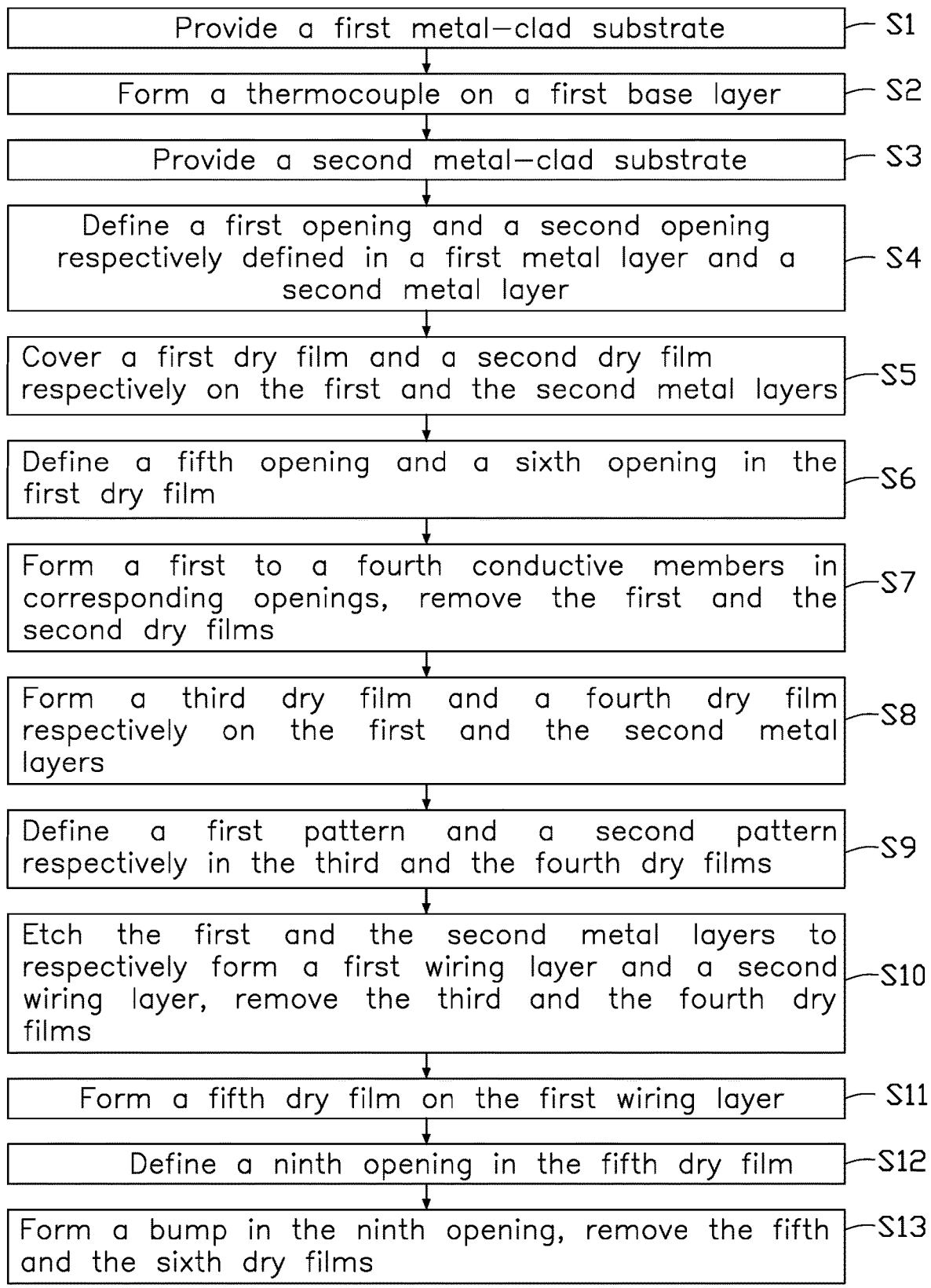
FIG. 15 is a flowchart of a method for manufacturing a circuit board according to an embodiment of the present disclosure.

The present disclosure also provides a method for manufacturing a circuit board. Referring to FIG. 15, the method is presented in accordance with an embodiment. The method is provided by way of example, as there are a variety of ways to carry out the method. The method can begin at S1.

Figure 2:
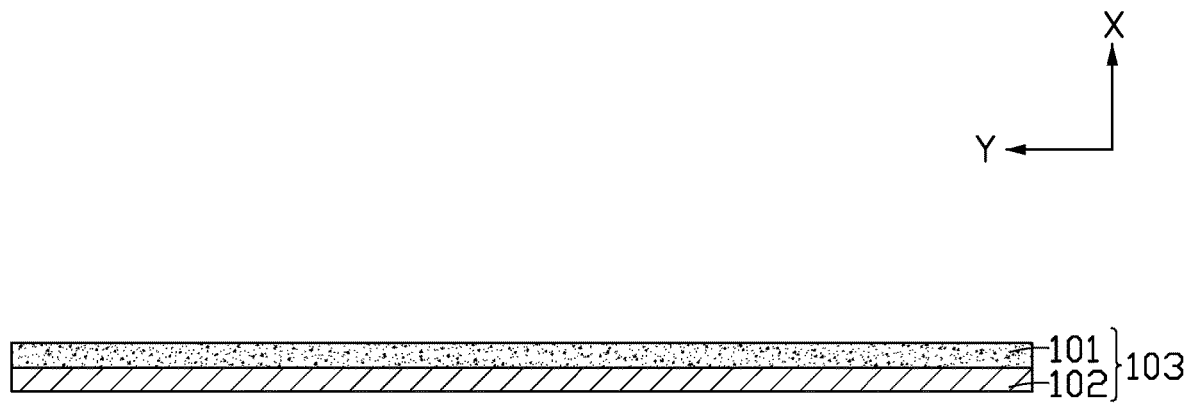
FIG. 2 is a diagrammatic view of a first metal-clad substrate according to an embodiment of the present disclosure.

At step S1, referring to FIG. 2, a first metal-clad substrate 103 is provided. The first metal-clad substrate 103 includes a first metal layer 102 and a first base layer 101 stacked in the first direction X.

In at least one embodiment, the first base layer 101 is made of an insulating resin, such as polypropylene (PP), polyimide (PI), liquid crystal polymer (LCP), polyethylene terephthalate (PET), and polyethylene naphthalate (PEN). The first metal layer 102 is made of copper.

Figure 3:
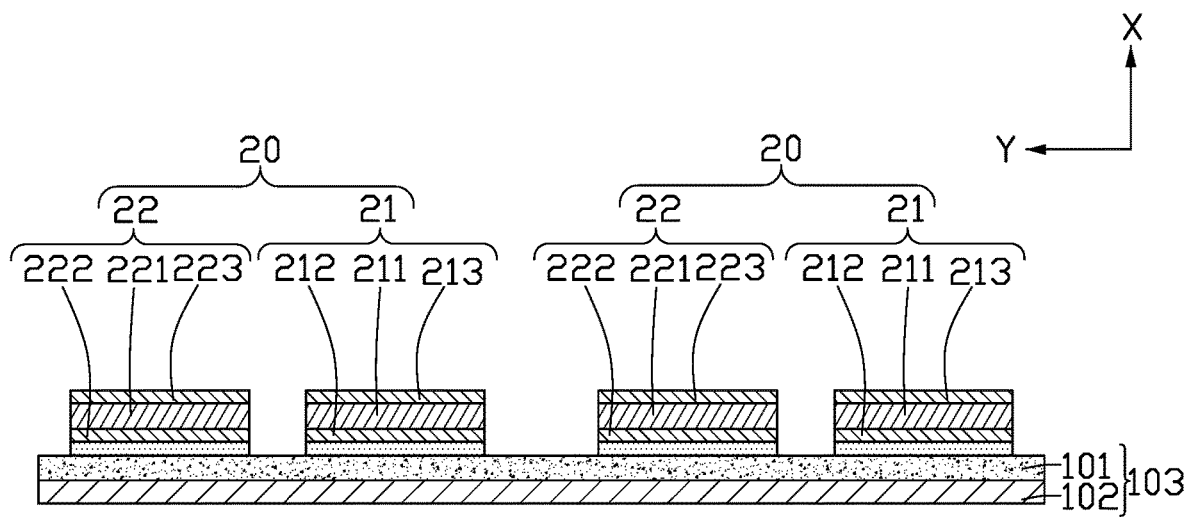
FIG. 3 is a diagrammatic view showing a thermocouple formed on the first metal-clad substrate of FIG. 2.

At step S2, referring to FIG. 3, at least one thermocouple 20 is formed on the first base layer 101. The thermocouple 20 includes a P-type semiconductor 21 and an N-type semiconductor 22 disposed in a second direction Y perpendicular to the first direction X. In this embodiment, at least two thermocouples 20 are formed on the first base layer 101, and are spaced from each other in the second direction Y.

In at least one embodiment, the P-type semiconductor 21 includes a first conductive layer 212, a P-type semiconductor layer 211, and a second conductive layer 213 stacked in the first direction X in that order. The N-type semiconductor 22 includes a third conductive layer 222, an N-type semiconductor layer 221, and a fourth conductive layer 223 stacked in the first direction X in that order.

Figure 4:
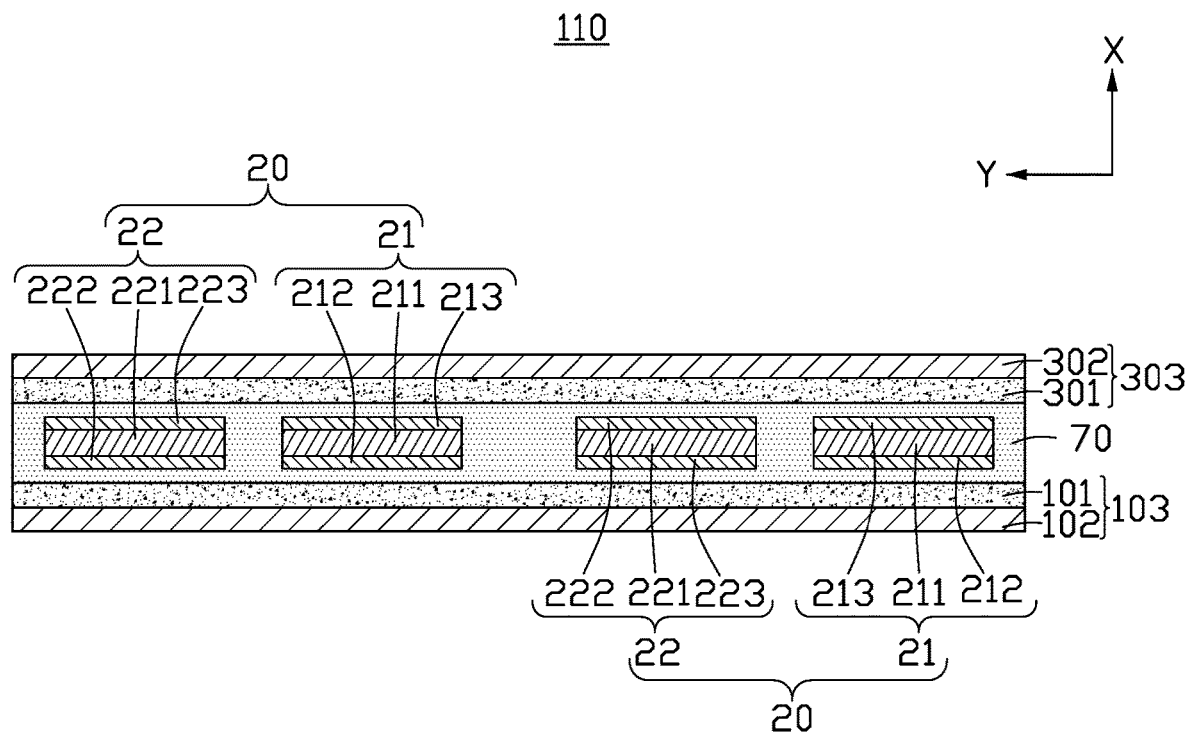
FIG. 4 is a diagrammatic view showing a second metal-clad substrate formed on the thermocouple of FIG. 3.

At step S3, referring to FIG. 4, a second metal-clad substrate 303 is provided. The second metal-clad substrate 303 includes a second base layer 301 and a second metal layer 302 stacked in the first direction X. The second metal-clad substrate 303 is formed on the thermocouple 20 through a first adhesive layer 70, thereby forming a composite substrate 110. The first adhesive layer 70 may be pressed to infill a gap between two adjacent thermocouples 20, so that the first adhesive layer 70 fixes the thermocouples 20 between the first metal-clad substrate 103 and the second metal-clad substrate 303.

In at least one embodiment, the second base layer 301 is made of an insulating resin, such as polypropylene (PP), polyimide (PI), liquid crystal polymer (LCP), polyethylene terephthalate (PET), and polyethylene naphthalate (PEN). The second metal layer 302 is made of copper.

Figure 5:
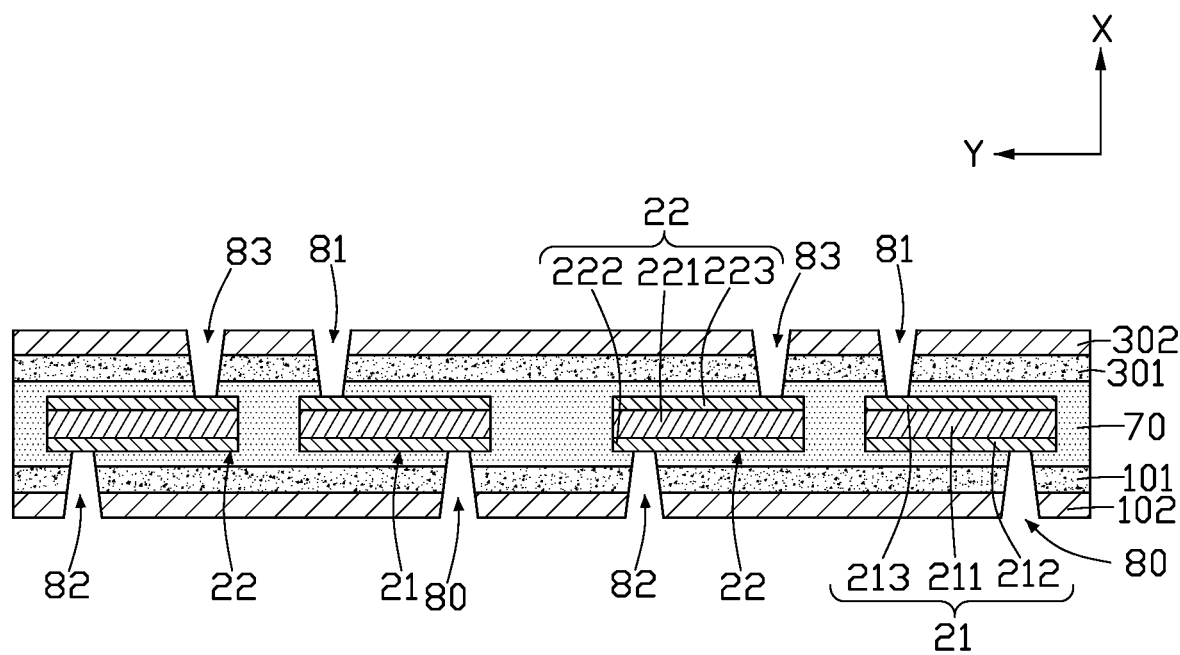
FIG. 5 is a diagrammatic view showing holes defined in the first and second metal-clad substrates of FIG. 4.

At step S4, referring to FIG. 5, a first opening 80 and a second opening 81 are respectively defined in the first metal layer 102 and the second metal layer 302. Each of the first opening 80 and the second opening 81 further extends towards the P-type semiconductor 21. For example, the first opening 80 extends towards the first conductive layer 212, and the second opening 81 extends towards the second conductive layer 213. The first conductive layer 212 and the second conductive layer 213 protect the P-type semiconductor layer 211 from being damaged when defining the holes.

Furthermore, a third opening 82 and a fourth opening 83 are respectively defined in the first metal layer 102 and the second metal layer 302. Each of the third opening 82 and the fourth opening 83 extends towards the N-type semiconductor 22. For example, the third opening 82 extends towards the third conductive layer 222, and the fourth opening 83 extends towards the fourth conductive layer 223. The third conductive layer 222 and the fourth opening 83 protect the N-type semiconductor 22 from being damaged when defining the holes.

Each of the first to fourth openings 80-83 may be formed by laser drilling or mechanical drilling.

Figure 6:
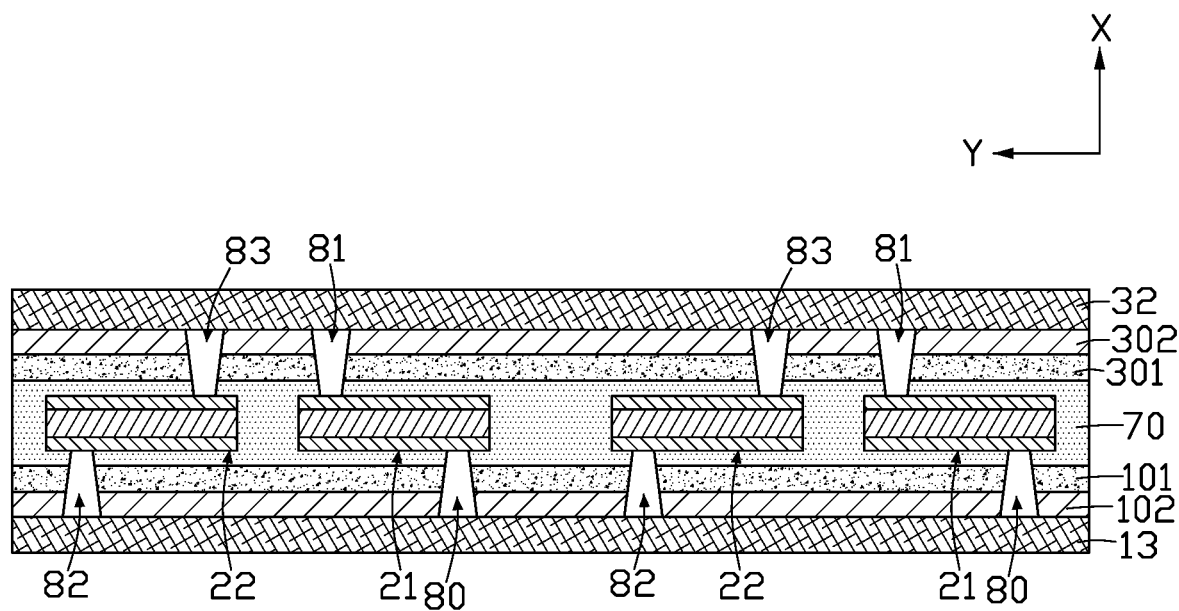
FIG. 6 is a diagrammatic view showing dry films covering the first and second metal-clad substrates of FIG. 5.

At step S5, referring to FIG. 6, a first dry film 13 and a second dry film 32 are respectively formed on the first metal layer 102 and the second metal layer 302. The first dry film 13 covers the first opening 80 and the third opening 82, and the second dry film 32 covers the second opening 81 and the fourth opening 83.

Figure 7:
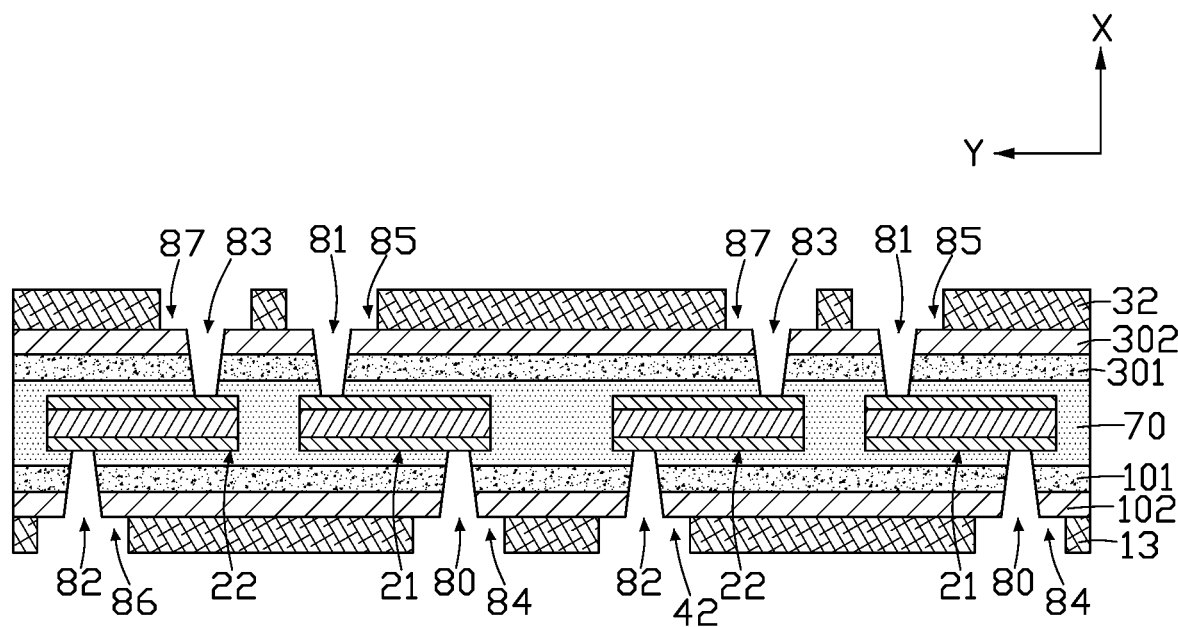
FIG. 7 is a diagrammatic view showing holes defined in the dry films of FIG. 6.

At step S6, referring to FIG. 7, a fifth opening 84 exposing the first opening 80 and a sixth opening 86 exposing the third opening 82 are defined in the first dry film 13. A diameter of the fifth opening 84 along the second direction Y is larger than that of the first opening 80, and a diameter of the sixth opening 86 along the second direction Y is larger than that of the third opening 82.

Furthermore, a seventh opening 85 exposing the second opening 81 and an eighth opening 87 exposing the fourth opening 83 are defined in the second dry film 32. A diameter of the seventh opening 85 along the second direction Y is larger than that of the second opening 81, and a diameter of the eighth opening 87 along the second direction Y is larger than that of the fourth opening 83.

Figure 8:
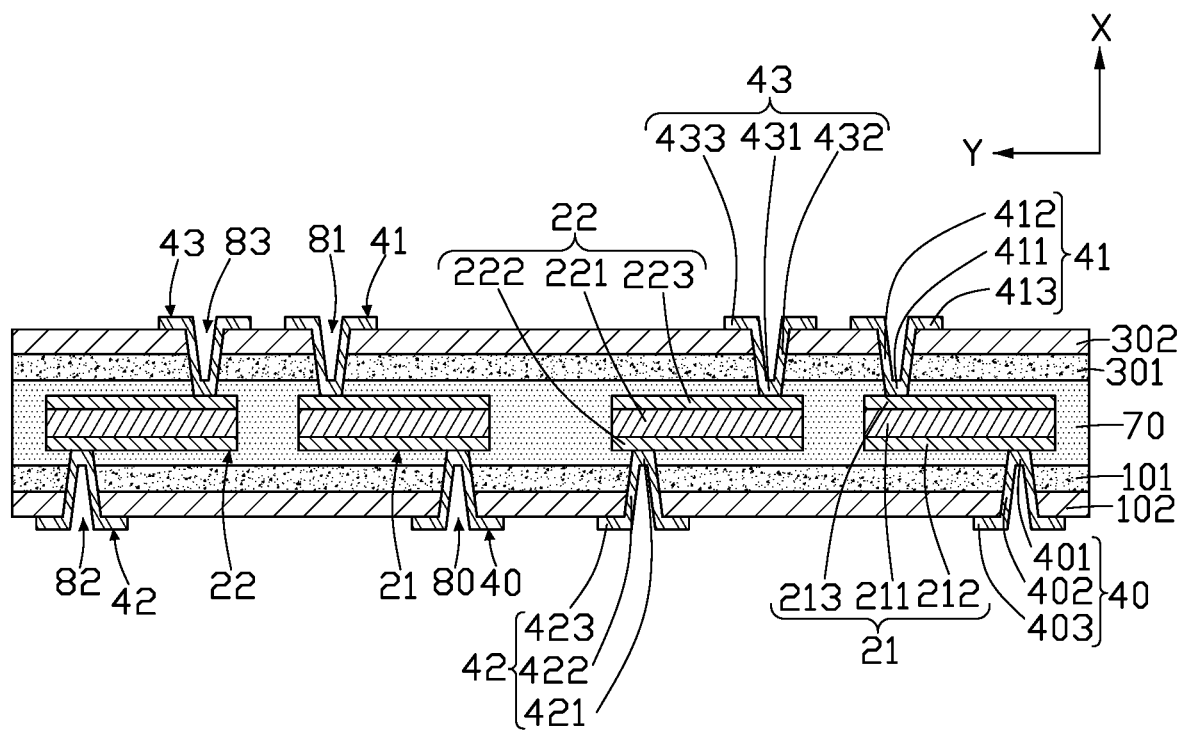
FIG. 8 is a diagrammatic view of conductive members formed in the opening of FIG. 7.

At step S7, referring to FIGS. 7 and 8, a first conductive member 40 is formed in each of the first opening 80 and the fifth opening 84. The first conductive member 40 includes a first portion 401, a third portion 403, and a second portion 402 electrically connecting the first portion 401 to the third portion 403. The first portion 401 is disposed on and electrically connected to the P-type semiconductor 21. The second portion 402 is disposed on a sidewall of the first opening 80. The third portion 403 is disposed in the fifth opening 84 and electrically connected to the first metal layer 102. The third portion 403 is disposed on a surface of the first metal layer 102 away from the P-type semiconductor 21.

A second conductive member 41 is formed in each of the second opening 81 and the seventh opening 85. The second conductive member 41 includes a first portion 411, a third portion 413, and a second portion 412 electrically connecting the first portion 411 to the third portion 413. The first portion 411 is disposed on and electrically connected to the P-type semiconductor 21. The second portion 412 is disposed on a sidewall of the second opening 81. The third portion 413 is disposed in the seventh opening 85 and electrically connected to the second metal layer 302. The third portion 413 is disposed on a surface of the second metal layer 302 away from the P-type semiconductor 21.

A third conductive member 42 is formed in each of the third opening 82 and the sixth opening 86. The third conductive member 42 includes a first portion 421, a third portion 423, and a second portion 422 electrically connecting the first portion 421 to the third portion 423. The first portion 421 is disposed on and electrically connected to the surface of the N-type semiconductor 22. The second portion 422 is disposed on a sidewall of the third opening 82. The third portion 423 is disposed in the sixth opening 86 and electrically connected to the first metal layer 102. The third portion 423 is disposed on the surface of the first metal layer 102 away from the N-type semiconductor 22.

A fourth conductive member 43 is formed in each of the fourth opening 83 and the eighth opening 87. The fourth conductive member 43 includes a first portion 431, a third portion 433, and a second portion 432 electrically connecting the first portion 431 to the third portion 433. The first portion 431 is disposed on and electrically connected to the N-type semiconductor 22. The second portion 432 is disposed on a sidewall of the fourth opening 83. The third portion 433 is disposed in the eighth opening 87 and electrically connected to the first metal layer 102. The third portion 432 is disposed on the surface of the first metal layer 102 away from the N-type semiconductor 22. The first conductive member 40, the second conductive member 41, the third conductive member 42, and the fourth conductive member 43 may be formed by electroplating, printing, or sputtering process.

Then, the first dry film 13 and the second dry film 32 are removed.

In at least one embodiment, referring to FIG. 8, the first conductive layer 212 is electrically connected to the first conductive member 40 and the P-type semiconductor layer 211, and the second conductive layer 213 is electrically connected to the second conductive member 41 and the P-type semiconductor layer 211. The third conductive layer 222 is electrically connected to the third conductive member 42 and the N-type semiconductor layer 221. The fourth conductive layer 223 is electrically connected to the fourth conductive member 43 and the N-type semiconductor layer 221.

In other embodiments, the first conductive member 40 and the second conductive member 41 may also be directly electrically connected to the P-type semiconductor layer 211. The third conductive member 42 and the fourth conductive member 43 may also be directly electrically connected to the N-type semiconductor layer 221.

In other embodiments, steps S5 and S6 may be omitted. At this time, at step S7, the first conductive member 40 is directly formed in the first opening 80, the second conductive member 41 is directly formed in the second opening 81, the third conductive member 42 is directly formed in the third opening 82, and the fourth conductive member 43 is directly formed in the fourth opening 83.

Figure 9:
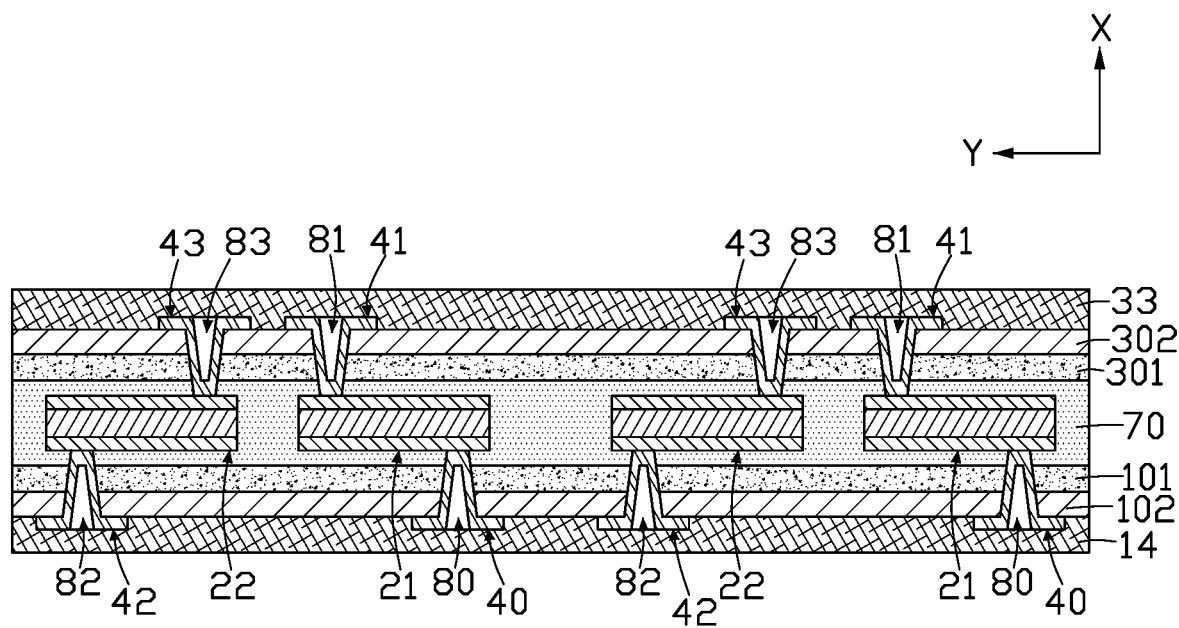
FIG. 9 is a diagrammatic view showing dry films covering the first and second metal-clad substrates of FIG. 8.

At step S8, referring to FIG. 9, a third dry film 14 is formed on the first metal layer 102, and a fourth dry film 33 is formed on the second metal layer 302. The third dry film 14 covers the first conductive member 40 and the third conductive member 42, and the fourth dry film 33 covers the second conductive member 41 and the fourth conductive member 43.

Figure 10:
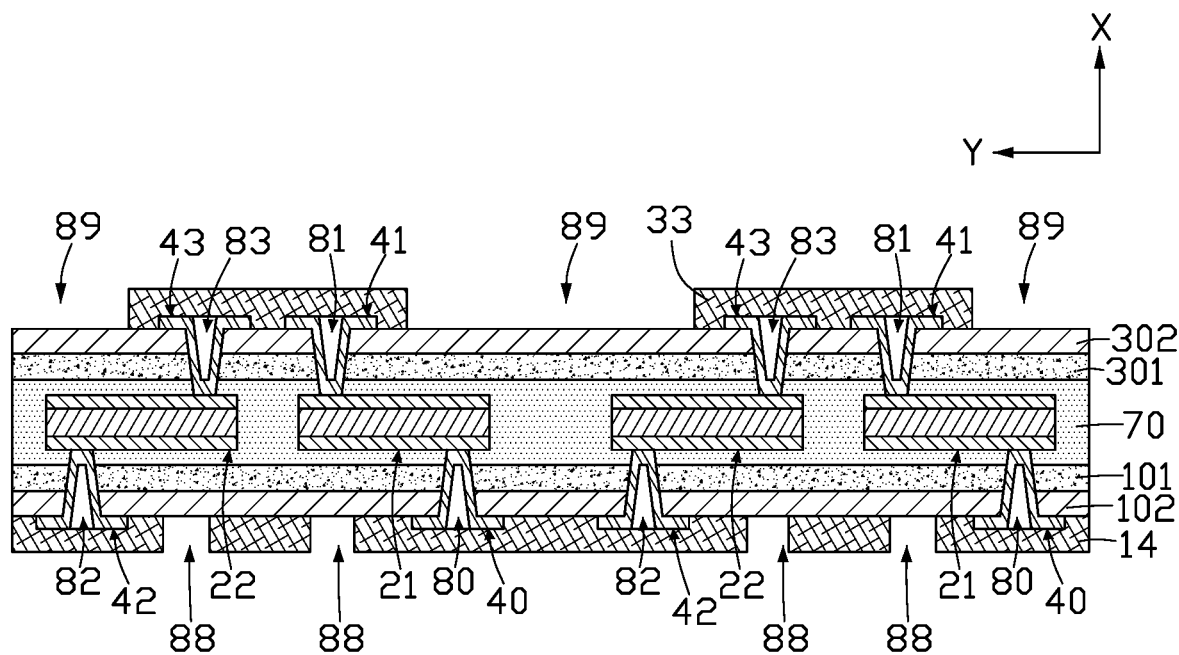
FIG. 10 is a diagrammatic view showing patterns defined in the dry films of FIG. 9.

At step S9, referring to FIG. 10, a first pattern 88 is defined in the third dry film 14 to expose a portion of the first metal layer 102. The first pattern 88 is staggered from each of the first conductive member 40 and the third conductive member 42 in the second direction Y. A second pattern 89 is defined in the fourth dry film 33 to expose a portion of the second metal layer 302. The second pattern 89 is staggered from each of the second conductive member 41 and the fourth conductive member 43 in the second direction Y.

Figure 11:
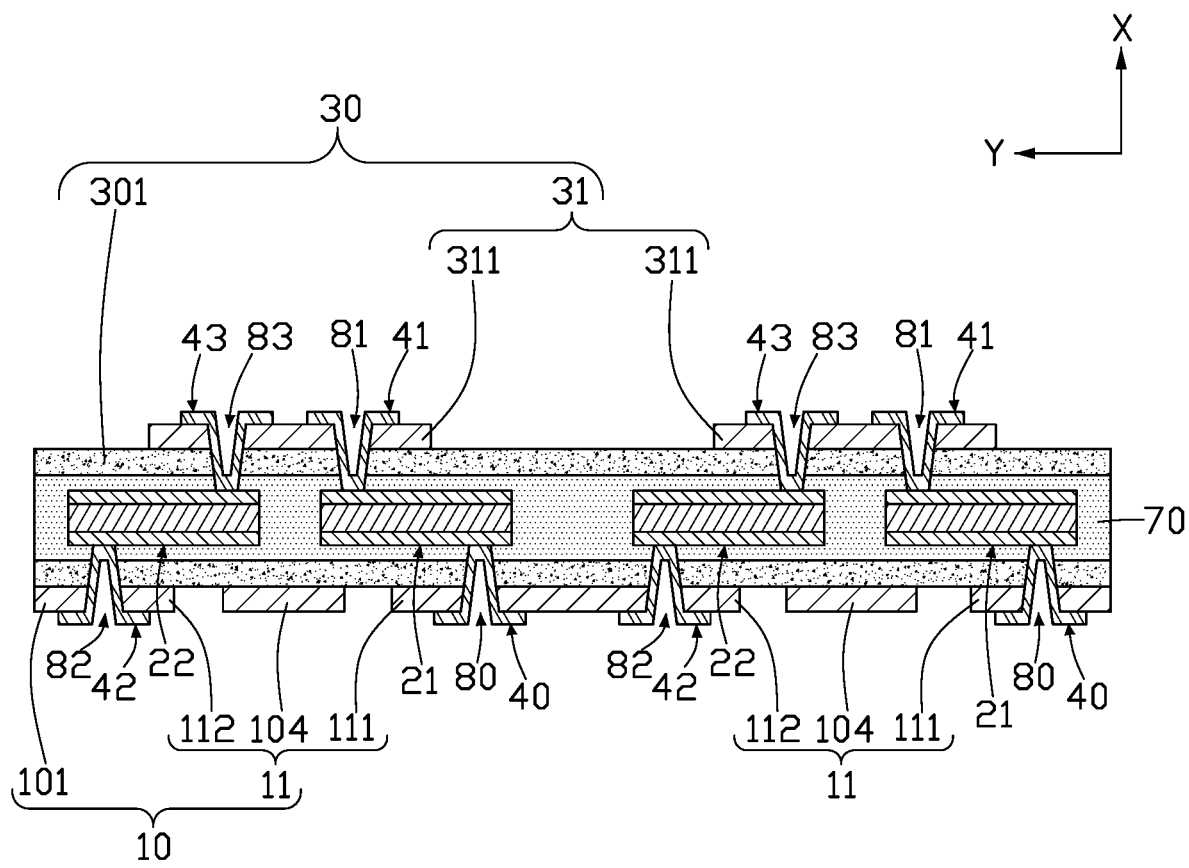
FIG. 11 is a diagrammatic view showing a first metal layer and a second metal layer of FIG. 10 etched to form a first wiring layer and a second wiring layer.

At step 10, referring to FIGS. 10 and 11, the portion of the first metal layer 102 exposed from the first pattern 88 is etched to form a first wiring layer 11. The portion of the second metal layer 302 exposed from the second pattern 89 is etched to form a second wiring layer 31. Then, the third dry film 14 and the fourth dry film 33 are removed.

The first wiring layer 11 and the first base layer 101 together form a first circuit substrate 10. The second wiring layer 31 and the second base layer 301 together form a second circuit substrate 30. The first wiring layer 11 includes a first wiring portion 111, a second wiring portion 112, and a heat dissipation pad 104. The second wiring layer 31 includes a third wiring portion 311.

Figure 12:
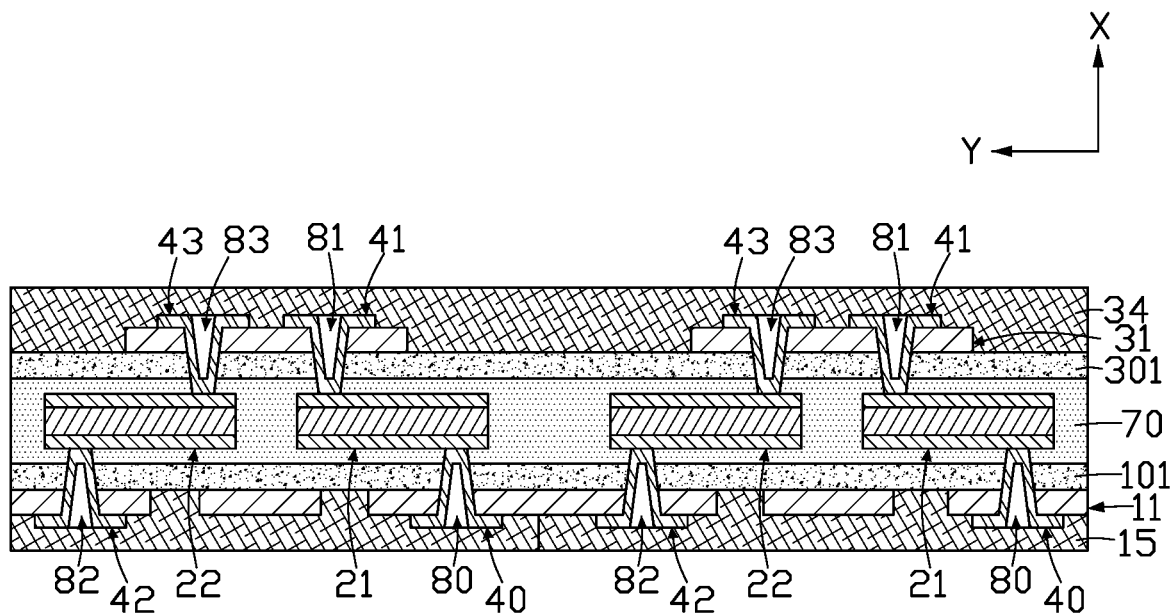
FIG. 12 is a diagrammatic view showing dry films covering the first and second wiring layers of FIG. 11.

At step 11, referring to FIG. 12, a fifth dry film 15 is formed on the first wiring layer 11. The fifth dry film 15 covers the first conductive member 40 and the third conductive member 42.

In at least one embodiment, a sixth dry film 34 covering the second wiring layer 31 may also be provided.

Figure 13:
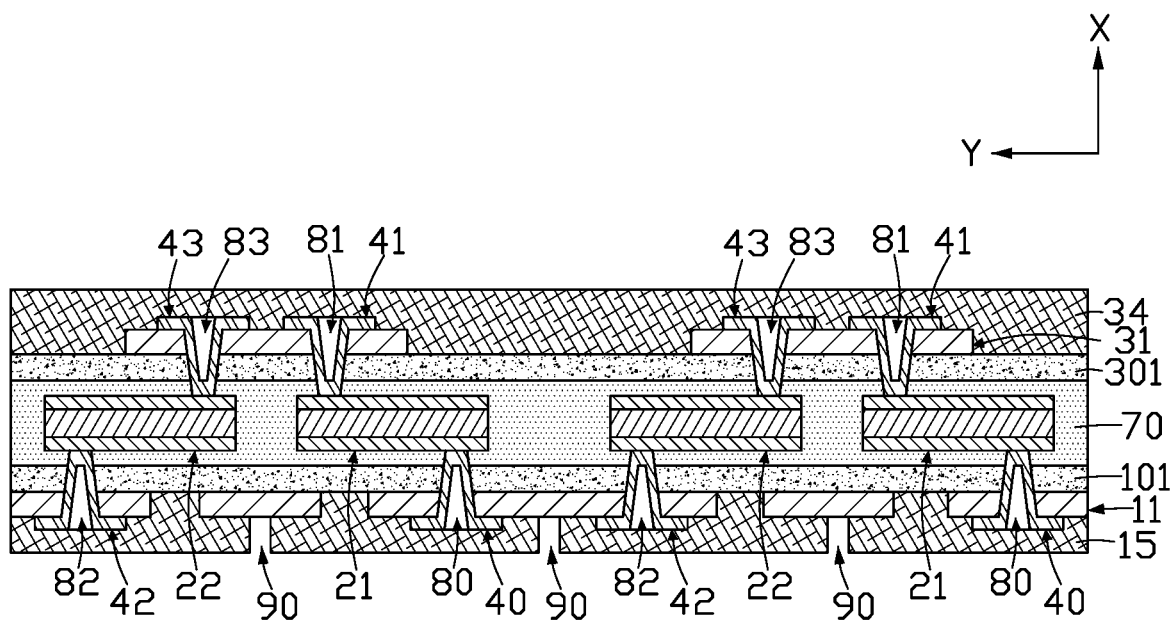
FIG. 13 is a diagrammatic view showing openings defined in the dry films of FIG. 12.

At step S12, referring to FIG. 13, a ninth opening 90 is defined in the fifth dry film 15 to expose the heat dissipation pad 104.

Figure 14:
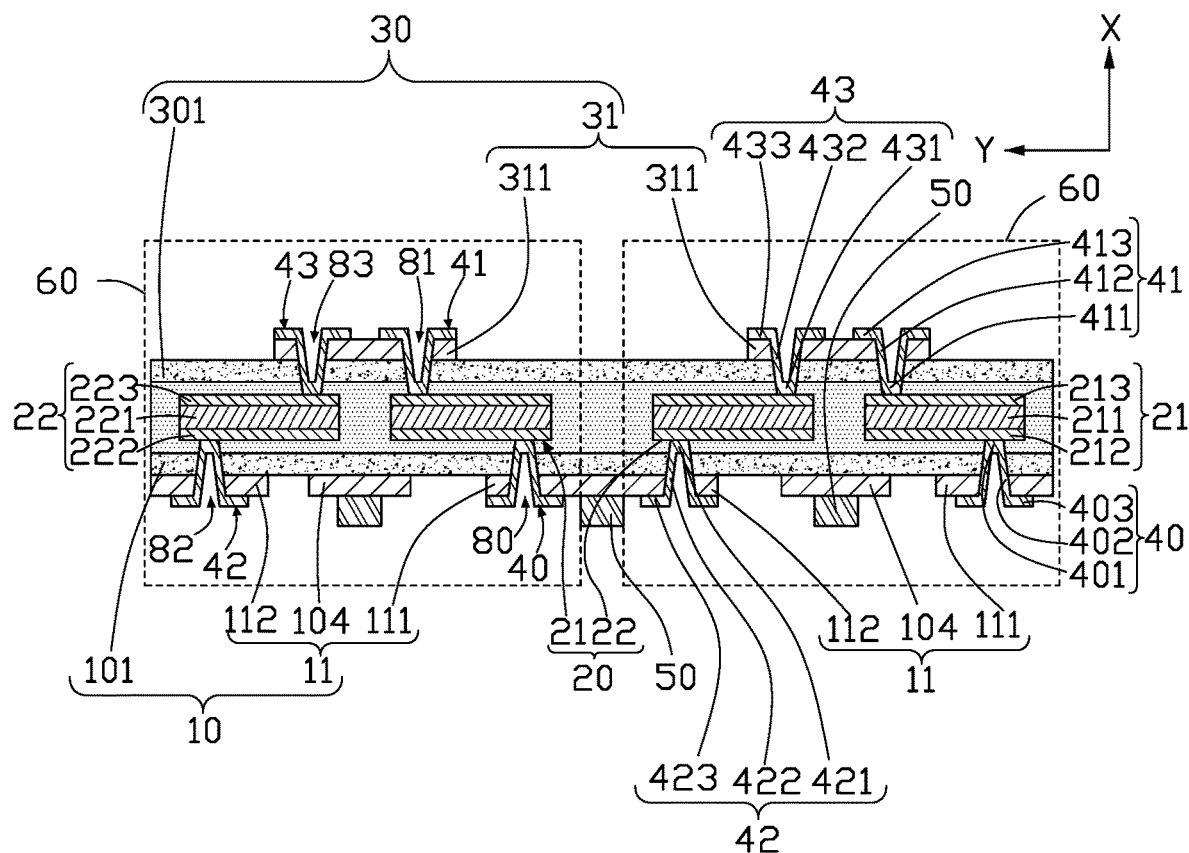
FIG. 14 is a diagrammatic view showing a bump formed in the openings of FIG. 13.

At step S13, referring to FIGS. 13 and 14, a bump 50 is formed in the ninth opening 90 and connected to the heat dissipation pad 104. Then, the fifth dry film 15 and the sixth dry film 34 are removed.

In at least one embodiment, the bump 50 may be made of copper, silver, or aluminum alloy, and formed by electroplating or electroless plating. The sixth dry film 34 prevents a plating solution used in any plating process from contacting the second wiring layer 31.

In other embodiments, steps S11 to S13 may be omitted. That is, the first wiring layer 11 does not include the bump 50.

At step S14, referring to FIG. 1, a protective layer 91 is formed on each of the first wiring layer 11 and the second wiring layer 31 through a second adhesive layer 71. The bump 50 is exposed from the protective layer 91. Then, the circuit board 100 is obtained.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A circuit board, comprising:
   at least one heat dissipation module each comprising:
      a first circuit substrate, at least one thermocouple, and a second circuit substrate stacked in a first direction, wherein the first circuit substrate comprises a first wiring layer, the first wiring layer comprises a first wiring portion and a second wiring portion spaced from each other in a second direction perpendicular to the first direction; each of the at least one thermocouple comprises a P-type semiconductor and an N-type semiconductor arranged in the second direction; the second circuit substrate comprises a second wiring layer, the second wiring layer comprises a third wiring portion;
      a first conductive member electrically connected to the P-type semiconductor and the first wiring portion;
      a second conductive member electrically connected to the P-type semiconductor and the third wiring portion;
      a third conductive member electrically connected to the N-type semiconductor and the second wiring portion; and
      a fourth conductive member electrically connected to the N-type semiconductor and the third wiring portion, the second conductive member and the fourth conductive member spaced from each other in the second direction,
   wherein the first wiring layer further comprises a heat dissipation pad, each of the at least one heat dissipation module further comprises a bump protruding from the heat dissipation pad; the first wiring portion, the heat dissipation pad, and the second wiring portion are spaced from each other in the second direction.

2. The circuit board according to claim 1, wherein the at least one heat dissipation module comprises two heat dissipation modules spaced from each other in the second direction, the third wiring portions of the two heat dissipation modules are spaced from each other in the second direction, the second wiring portion of one of the two heat dissipation modules is electrically connected to the first wiring portion of another one of the two heat dissipation modules.

3. The circuit board according to claim 1, wherein the P-type semiconductor comprises a P-type semiconductor layer, the N-type semiconductor comprises an N-type semiconductor layer, and each of the P-type semiconductor layer.

4. The circuit board according to claim 3, wherein each of the P-type semiconductor layer and the N-type semiconductor layer comprises bismuth telluride.

5. The circuit board according to claim 3, wherein the P-type semiconductor further comprises a first conductive layer and a second conductive layer formed on opposite surfaces of the P-type semiconductor layer, the first conductive layer is electrically connected to the first conductive member and the P-type semiconductor layer, and the second conductive layer is electrically connected to the second conductive member and the P-type semiconductor layer.

6. The circuit board according to claim 1, wherein the N-type semiconductor further comprises a third conductive layer and a fourth conductive layer formed on opposite surfaces of the N-type semiconductor layer, the third conductive layer is electrically connected to the third conductive member and the N-type semiconductor layer, and the fourth conductive layer is electrically connected to the fourth conductive member and the N-type semiconductor layer.

7. The circuit board according to claim 1, wherein the first circuit substrate defines a first opening and a third opening, the first opening extends towards the P-type semiconductor, the third opening extends towards the N-type semiconductor; the second circuit substrate defines a second opening and a fourth opening, the second opening extends towards the P-type semiconductor, the fourth opening extends towards the N-type semiconductor;

the first conductive member and the second conductive member are respectively disposed in the first opening and the second opening, the third conductive member and the fourth conductive member are respectively disposed in the third opening and the fourth opening.

8. The circuit board according to claim 7, wherein the first conductive member comprises a first portion, a third portion, and a second portion electrically connecting the first portion to the third portion; the first portion is disposed on the P-type semiconductor, the second portion is disposed on a sidewall of the first opening, and the third portion is disposed on the first wiring portion.

9. The circuit board according to claim 1, wherein each of the first conductive member, the conductive member, the third conductive member, and the fourth conductive member comprises copper, iron, or silver.

* * * * *